US010620274B2

(12) United States Patent
van Lammeren (10) Patent No.: US 10,620,274 B2
(45) Date of Patent: Apr. 14, 2020

(54) METHOD AND APPARATUS FOR CONTACT DETECTION IN BATTERY PACKS

(71) Applicant: Datang NXP Semiconductors Co., Ltd., Jiangsu (CN)

(72) Inventor: Joop van Lammeren, Jiangsu (CN)

(73) Assignee: Datang NXP Semiconductor Co., Ltd., Jiangsu (CN)

( * ) Notice: Subject to any disclaimer, the term of this patent is extended or adjusted under 35 U.S.C. 154(b) by 1162 days.

(21) Appl. No.: 14/807,414

(22) Filed: Jul. 23, 2015

(65) Prior Publication Data

US 2016/0169980 A1  Jun. 16, 2016

Related U.S. Application Data

(63) Continuation-in-part of application No. 14/565,574, filed on Dec. 10, 2014.

(51) Int. Cl.
*H01M 10/42* (2006.01)
*H01M 10/48* (2006.01)
(Continued)

(52) U.S. Cl.
CPC .......... *G01R 31/392* (2019.01); *B60L 3/0046* (2013.01); *B60L 50/64* (2019.02);
(Continued)

(58) Field of Classification Search
None
See application file for complete search history.

(56) References Cited

U.S. PATENT DOCUMENTS

| 6,133,709 A | 10/2000 | Puchianu |
| 2007/0285054 A1 | 12/2007 | Li et al. |

(Continued)

FOREIGN PATENT DOCUMENTS

| EP | 1967408 A2 | 9/2008 |
| EP | 2408053 A2 | 1/2012 |

(Continued)

OTHER PUBLICATIONS

European Search Report for EP Application No. 151992492-1568 dated May 23, 2016.

(Continued)

*Primary Examiner* — Barbara L Gilliam
(74) *Attorney, Agent, or Firm* — Harness, Dickey & Pierce, P.L.C.

(57) ABSTRACT

Method and apparatus for contact detection in battery packs are disclosed. A battery pack, comprising: at least a first battery cell and a second battery cell, the first battery cell having a first electrode and a second electrode, and the second battery cell having a third electrode and a fourth electrode; a power bar for coupling the second electrode of the first battery cell to the third electrode of the second battery cell; a communication wire for signal communication between the first battery cell and the second battery cell, wherein the first battery cell comprises a supervisor, which comprises a voltage detector to measure a first voltage between the first electrode and the second electrode of the first battery cell in a first state, and to measure a second voltage between the first electrode of the first battery cell and the communication wire in a second state; and a digital circuit to compute a voltage difference between the first voltage and the second voltage, and to indicate degraded contact of the power bar if the voltage difference is out of a predetermined threshold range. A battery cell and a method for monitoring a battery pack are also disclosed.

14 Claims, 5 Drawing Sheets

(51) Int. Cl.
    *G01R 31/392*     (2019.01)
    *G01R 31/396*     (2019.01)
    *B60L 58/21*     (2019.01)
    *G01R 31/3835*     (2019.01)
    *B60L 3/00*     (2019.01)
    *H01M 2/20*     (2006.01)
    *B60L 50/64*     (2019.01)
    *G01R 31/04*     (2006.01)

(52) U.S. Cl.
    CPC ............ *B60L 58/21* (2019.02); *G01R 31/043* (2013.01); *G01R 31/3835* (2019.01); *G01R 31/396* (2019.01); *H01M 2/206* (2013.01); *H01M 10/482* (2013.01); *B60L 2240/547* (2013.01); *H01M 2010/4278* (2013.01); *Y02T 10/7005* (2013.01); *Y02T 10/7061* (2013.01); *Y02T 90/16* (2013.01)

(56) References Cited

U.S. PATENT DOCUMENTS

| | | |
|---|---|---|
| 2010/0259221 A1 | 10/2010 | Tabatowski-Bush |
| 2012/0249334 A1 | 10/2012 | Dao et al. |
| 2012/0256598 A1* | 10/2012 | Hsu ...................... H01M 2/202 320/148 |
| 2013/0021037 A1 | 1/2013 | Deveau et al. |
| 2013/0088237 A1 | 4/2013 | Kamata et al. |
| 2013/0245970 A1 | 9/2013 | Zhang |
| 2013/0337294 A1 | 12/2013 | Achhammer |
| 2014/0018990 A1* | 1/2014 | Kataoka .............. B60L 11/1851 701/22 |
| 2014/0278174 A1 | 9/2014 | Biskup et al. |
| 2015/0221994 A1 | 8/2015 | Ziemian et al. |

FOREIGN PATENT DOCUMENTS

| | | |
|---|---|---|
| EP | 2803109 A1 | 11/2014 |
| JP | 2010256155 A | 11/2010 |
| WO | WO-2013/104394 A1 | 7/2013 |

OTHER PUBLICATIONS

European Search Report for EP Application No. 151992575-1568 dated May 23, 2016.

* cited by examiner

METHOD AND APPARATUS FOR CONTACT DETECTION IN BATTERY PACKS

CROSS-REFERENCE TO RELATED APPLICATIONS

This application is a continuation-in-part of U.S. application Ser. No. 14/565,574 filed on Dec. 10, 2014. The disclosure of the above application is incorporated herein by reference.

FIELD OF THE INVENTION

This disclosure generally relates to battery packs, and more specifically to method and apparatus for supervision in battery packs.

BACKGROUND OF THE INVENTION

Battery packs formed with a number of series-connected battery cells are widely employed for power supply, especially in mobile appliances. As known, in (hybrid) electric vehicles, a battery pack is used to generate a high voltage to drive the motor. In such a battery pack, the number of battery cells are coupled in series by electrically conducting power bars, wherein each power bar can electrically couple a positive electrode of one battery cell to a negative electrode of an adjacent battery cell, e.g., by soldering or bolting.

Each component on a current path in the battery pack is preferably designed to have a small resistance in order to reduce useless power dissipation, especially when a current flowing through the battery cells is large (e.g., several 100 A). Usually, the contact resistance between the power bars and the battery electrodes may be taken into account. Moreover, this contact resistance will rise if the contact gets corroded, loose, aging, etc. If the pack current is high, even a contact resistance of just 1 m would be unacceptable. For example, with a pack current of 100 A, it would give rise to a power dissipation of 10 W, which is undesirable. Furthermore, a high contact resistance would lead to a hotspot that can severely limit the lifetime of the battery cell involved. In case of severe corrosion, the temperature rise may even cause a fire or explosion.

Accordingly, it is desirable for methods and systems for contact detection in battery packs.

SUMMARY OF THE INVENTION

Method and apparatus for contact detection in battery packs are disclosed.

In one embodiment, a battery pack is disclosed, comprising: at least a first battery cell and a second battery cell, the first battery cell having a first electrode and a second electrode, and the second battery cell having a third electrode and a fourth electrode; a power bar for coupling the second electrode of the first battery cell to the third electrode of the second battery cell; a communication wire for signal communication between the first battery cell and the second battery cell, wherein the first battery cell comprises a supervisor, which comprises a voltage detector to measure a first voltage between the first electrode and the second electrode of the first battery cell in a first state, and to measure a second voltage between the first electrode of the first battery cell and the communication wire in a second state; and a digital circuit to compute a voltage difference between the first voltage and the second voltage, and to indicate degraded contact of the power bar if the voltage difference is out of a predetermined threshold range.

In one aspect, the supervisor further comprises a first switch, and the voltage detector has a first input terminal coupled to the first electrode of the first battery cell and a second input terminal coupled to the first switch, wherein in the first state, the first switch couples the second input terminal of the voltage detector to the second electrode of the first battery cell; and wherein in the second state, the first switch couples the second input terminal of the voltage detector to the communication wire.

In one aspect, in the second state, the voltage detector measures the second voltage between the first electrode of the first battery cell and the communication wire when the second battery cell transmits on the communication wire at a voltage of the third electrode of the second battery cell.

In one aspect, the second battery cell further comprises a second switch, wherein in the second state, the second switch couples the communication wire to the third electrode of the second battery cell. In one aspect, the first switch and the second switch are single-pole double-throw (SPDT) switches. In one aspect, the degraded contact comprises at least one of contact corrosion or loose-contact.

In one aspect, the battery pack further comprises: a pack controller for controlling operation of the battery pack, wherein the at least the first battery cell and the second battery cell communicate with the pack controller through a daisy chain of communication wires, wherein the digital circuit is integrated in the supervisor of the first battery cell, or the digital circuit is integrated in the pack controller.

In one aspect, the digital circuit comprises: an operational amplifier, an adder, or a subtractor to calculate the voltage difference between the first and second voltages; and a comparator to determine whether the voltage difference is in the predetermined threshold range.

In one aspect, the first electrode and the third electrode are positive electrodes, and the second electrode and the fourth electrode are negative electrodes; or the first electrode and the third electrode are negative electrodes, and the second electrode and the fourth electrode are positive electrodes. In one aspect, the voltage detector comprises an Analog-to-Digital Converter (ADC).

In another embodiment, a battery cell is provided, comprising: a first electrode and a second electrode; a power bar coupled to the second electrode of the battery cell for power transmission; a first communication wire for signal communication from/to the battery cell; a first switch; a voltage detector having a first input terminal coupled to the first electrode of the first battery cell and a second input terminal coupled to the first switch, wherein the first switch is configured to couple the second input terminal of the voltage detector to the second electrode of the battery cell in a first state, and to couple the second input terminal of the voltage detector to the first communication wire in a second state, such that the voltage detector measures a first voltage between the first electrode and the second electrode of the first battery cell in the first state, and measures a second voltage between the first electrode of the first battery cell and the communication wire in the second state; and a digital circuit to compute a voltage difference between the first voltage and the second voltage, and to indicate degraded contact of the power bar if the voltage difference is out of a predetermined threshold range.

In one aspect, the battery cell further comprises: a second communication wire for signal communication from/to the battery cell; and a second switch to couple the second communication wire to the first electrode of the battery cell in the second state. In one aspect, the battery cell further comprises a transmitter/receiver coupled to the first communication wire, wherein the second switch couples the transmitter/receiver to the second communication wire in the first state.

In one aspect, the first switch and the second switch are single-pole double-throw (SPDT) switches. In one aspect, the degraded contact comprises at least one of contact corrosion or loose-contact.

In yet another embodiment, a method for monitoring a battery pack that comprises at least a first battery cell and a second battery cell is provided, the first battery cell having a first electrode and a second electrode, and the second battery cell having a third electrode and a fourth electrode, wherein the second electrode of the first battery cell is coupled to the third electrode of the second battery cell by a power bar, the method comprising: measuring a first voltage between the first electrode and the second electrode of the first battery cell in a first state; measuring a second voltage between the first electrode of the first battery cell and a communication wire in a second state, wherein the communication wire is configured for signal communication between the first battery cell and the second battery cell; computing a voltage difference between the first voltage and the second voltage; and indicating degraded contact of the power bar if the voltage difference is out of a predetermined threshold range.

In one aspect, the method further comprises: measuring the second voltage between the first electrode of the first battery cell and the communication wire in the second state when the second battery cell transmits on the communication wire at a voltage of the third electrode of the second battery cell.

In one aspect, the method further comprises: coupling the communication wire to the third electrode of the second battery cell in the second state; and measuring the second voltage between the first electrode of the first battery cell and the communication wire.

In one aspect, the degraded contact comprises at least one of contact corrosion or loose-contact. In one aspect, the first electrode and the third electrode are positive electrodes, and the second electrode and the fourth electrode are negative electrodes; or the first electrode and the third electrode are negative electrodes, and the second electrode and the fourth electrode are positive electrodes.

With this invention, the (onset of) degradation (e.g., corrosion or loosening) of a contact can be detected by the cell supervisor, without the need to add external components or wires to the battery pack. By measuring a first voltage between a first electrode and a second electrode of a battery cell in a first state, measuring a second voltage between the first electrode and a communication wire in a second state, and then monitoring the voltage difference between the first voltage and the second voltage, an increase of the contact resistance can be detected for each individual power bar in the battery pack. By reusing the communication wire to detect the second voltage, extra components or wires can be reduced. All required additional circuitry can be easily integrated into the cell supervisor. Such detection is beneficial to improve the performance of the battery pack, extend the battery lifetime between recharges, and avoid potential damage to the battery pack.

BRIEF DESCRIPTION OF THE DRAWINGS

Further features and advantages will become apparent from the following and more particular description of the preferred embodiments of the invention, as illustrated in the accompanying drawings, in which like referenced numerals generally refer to the same parts or elements throughout the drawings, and in which.

DETAILED DESCRIPTION OF THE INVENTION

The detailed description set forth below in connection with the accompany drawings is intended as a description of exemplary embodiments of the present invention and is not intended to represent the only exemplary embodiments in which the present invention can be practiced. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the exemplary embodiments presented herein.

The term "example" or "exemplary" as used throughout this application is only by way of illustration, and not limitation. Further, it will be understood that when an element is referred to as being "connected to" or "coupled to" another element, it can be directly connected or coupled to the other element or intervening elements may be present. For reference numerals with letter character designations such as "202a" or "202b", the letter character designations may differentiate two like parts or elements present in the same figure. Such letter character designations may be omitted when it is intended that a reference numeral to encompass all parts having the same reference numeral in all Figures.

Figure 1:
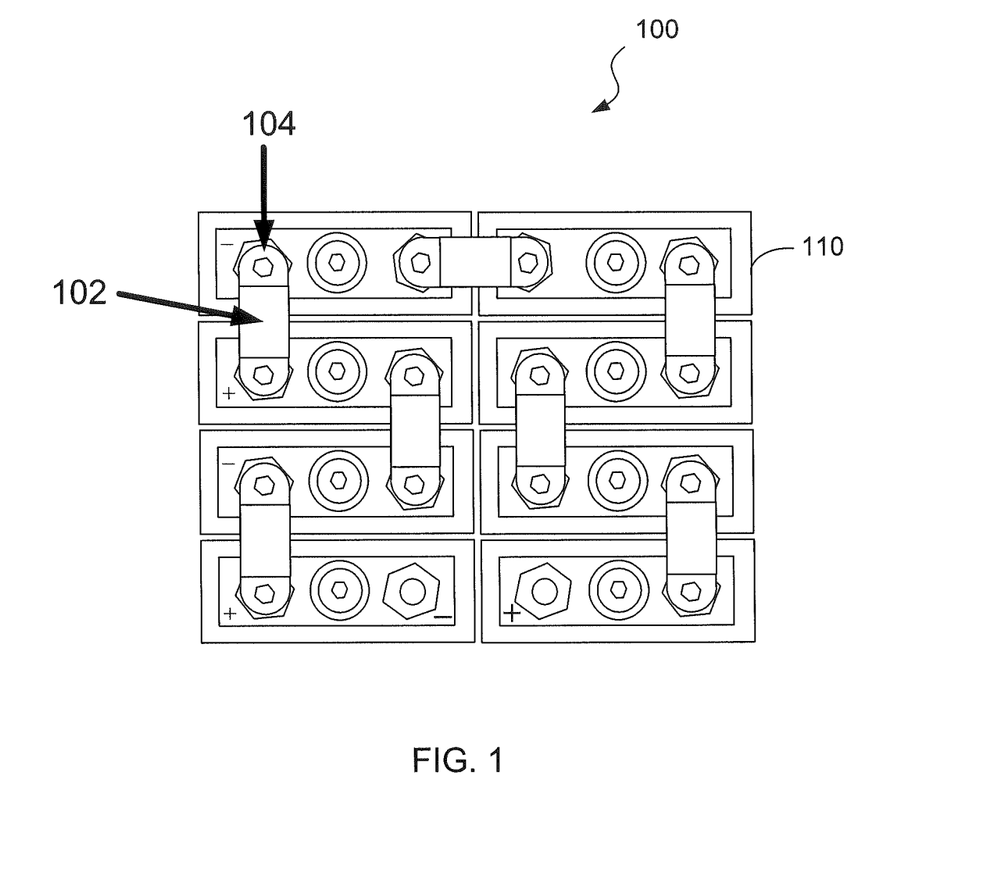
FIG. 1 is a top view of an exemplary battery pack, according to an embodiment of the invention.

FIG. 1 is a top view of an exemplary battery pack 100 comprised of a plurality of battery cells 110. For clarity, the battery pack 100 is illustrated with 8 battery cells 110. However, it should be understood that, a battery pack according this invention can have more or less battery cells. The battery cells 110 are coupled in series by electrically conducting power bars 102, each of which connects a positive electrode of one battery cell to a negative electrode of an adjacent battery cell. Such power bars 102 can be electrically connected to the cell electrodes by soldered or bolted contacts 104, etc.

Figure 2:
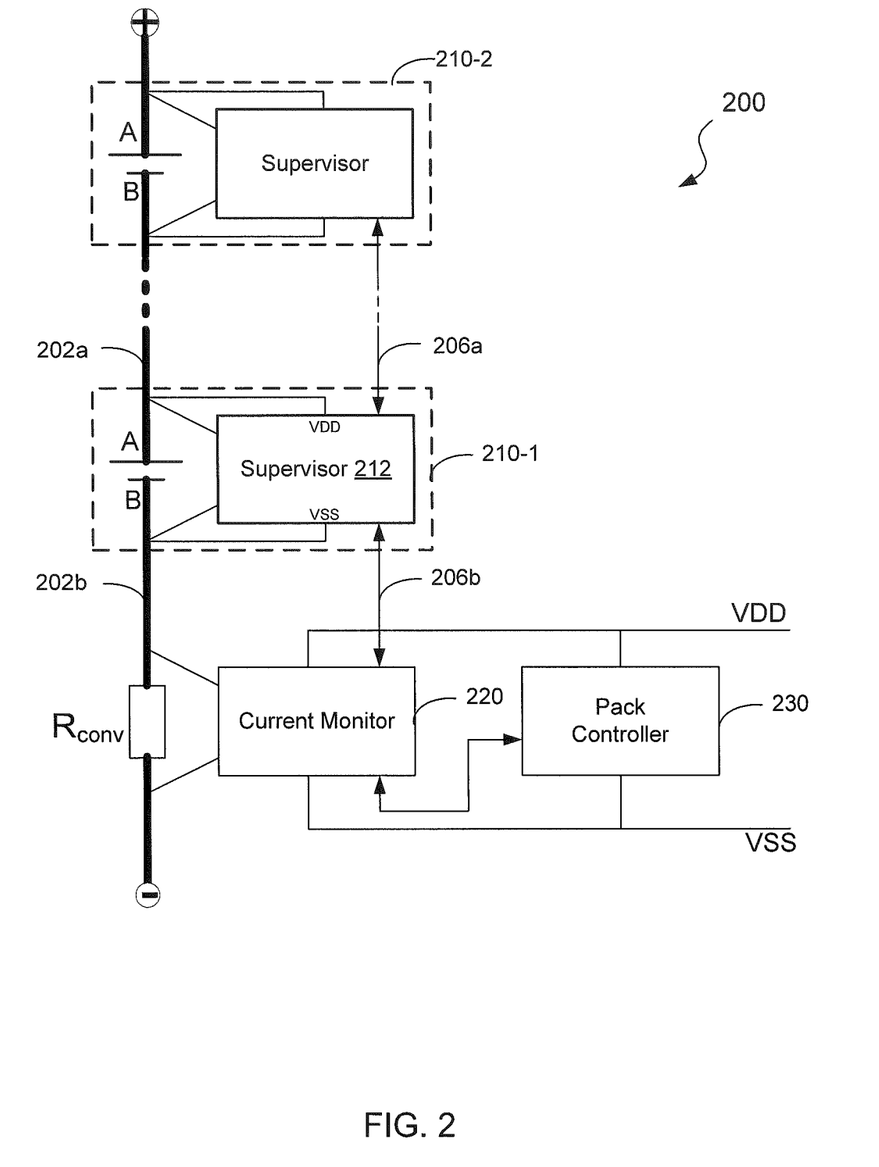
FIG. 2 schematically depicts a block diagram of a battery pack with integrated supervisors, according to an embodiment of the invention.

FIG. 2 schematically depicts a block diagram of a battery pack 200 with integrated supervisors 212, according to an embodiment of the invention. The battery pack 200 includes a plurality of battery cells 210 serially connected by power bars 202 (e.g., 202a, 202b). Each battery cell 210 has a positive electrode A and a negative electrode B. The individual ends of the power bars 202 may be electrically coupled to the respective cell electrodes by soldered or bolted contacts, or the like.

FIG. 2 also shows an optional conversion resistor, Rconv, connected in series with the battery cells 210. An optional current monitor 220 can detect a voltage drop across the resistor Rconv, which effectively reflects the pack current flowing through the serially-connected battery cells 210 and thus may be used for purpose of supervision. The battery pack 200 may further include a pack controller 230 to control the operation of the battery pack 200 based on detected measurements and/or input commands. The battery cells 210 (as well as the current monitor 220, if applicable) may communicate with the pack controller 230 through a daisy chain of communication wires 206. In particular, a signal intended to be communicated between any battery cell 210 and the pack controller 230 may pass through other battery cells 210 (or other components, if any) located therebetween. The communication on the communication wire 206 can take place in the current domain or voltage domain.

According to an embodiment of this invention, one or more of the battery cells 210 may have an integrated supervisor 212 for at least contact detection for the battery cell 210. Such a supervisor 212 may be integrated within the battery cell 210. Alternatively, the supervisor 212 can be built into the battery pack 200 and external to the associated battery cell 210, preferably as close as possible to the battery cell being monitored.

According to an embodiment of this invention, the battery cell 210 supplies voltages VDD and VSS for the associated supervisor 212, where the DC level of the communication wire 206 can be set based on (e.g., equal to) the VDD of the transmitting supervisor 212. During a normal condition, the power bar 202 between each pair of battery cells 210 has the same (or substantially the same) potential as the connected cell electrodes, and thus can act as the signal ground (VSS) for the corresponding communication wire 206. For example, the potential on the communication line 206a is approximately equal to the potential on the electrode A of the battery cell 210-1, or the potential on the electrode A of the battery cell 210-1 plus a cell voltage of the battery cell 210-2, depending on which supervisor 212 is transmitting on the communication line 206a.

However, if a contact between the power bar 202 and a cell electrode is degraded (e.g., corroded, loose, or otherwise compromised), a contact resistance between the power bar 202 and the cell electrode will increase and cause an increased voltage drop. Accordingly, the potential downstream in the current path from the degraded contact will decrease as compared to that in a normal situation. For example, the potential on the communication line 206a will decrease when the battery cell 210-2 is transmitting on the communication line 206a to the battery cell 210-1, as compared with normal condition. Therefore, it is possible for the supervisor 212 to perform contact supervision by monitoring potentials on the electrodes and the communication lines 206. Moreover, the communication line 206a may be selectively connected to the electrode B of the battery cell 210-2, so that the supervisor 212 in the battery cell 210-1 can measure a potential on the electrode B of the battery cell 210-2.

In particular, the supervisor 212 associated with the battery cell 210-1 is configured to measure a first voltage across the battery cell 210-1 (e.g., a voltage between the two electrodes A and B of the battery cell 210-1) and a second voltage between the electrode B of the battery cell 210-1 and the communication line 206a. By monitoring a voltage difference between the first voltage and the second voltage, an increase of the contact resistance can be measured for power bar 202a. For example, the supervisor 210 or the pack controller 230 may compute a voltage difference between the first voltage and the second voltage for a certain battery cell 210, and compare the voltage difference to a threshold value (or a threshold range), so as to ascertain whether a contact of an associated power bar is compromised (e.g., corroded, loose, or the like), as further described in details below.

Figure 3A:
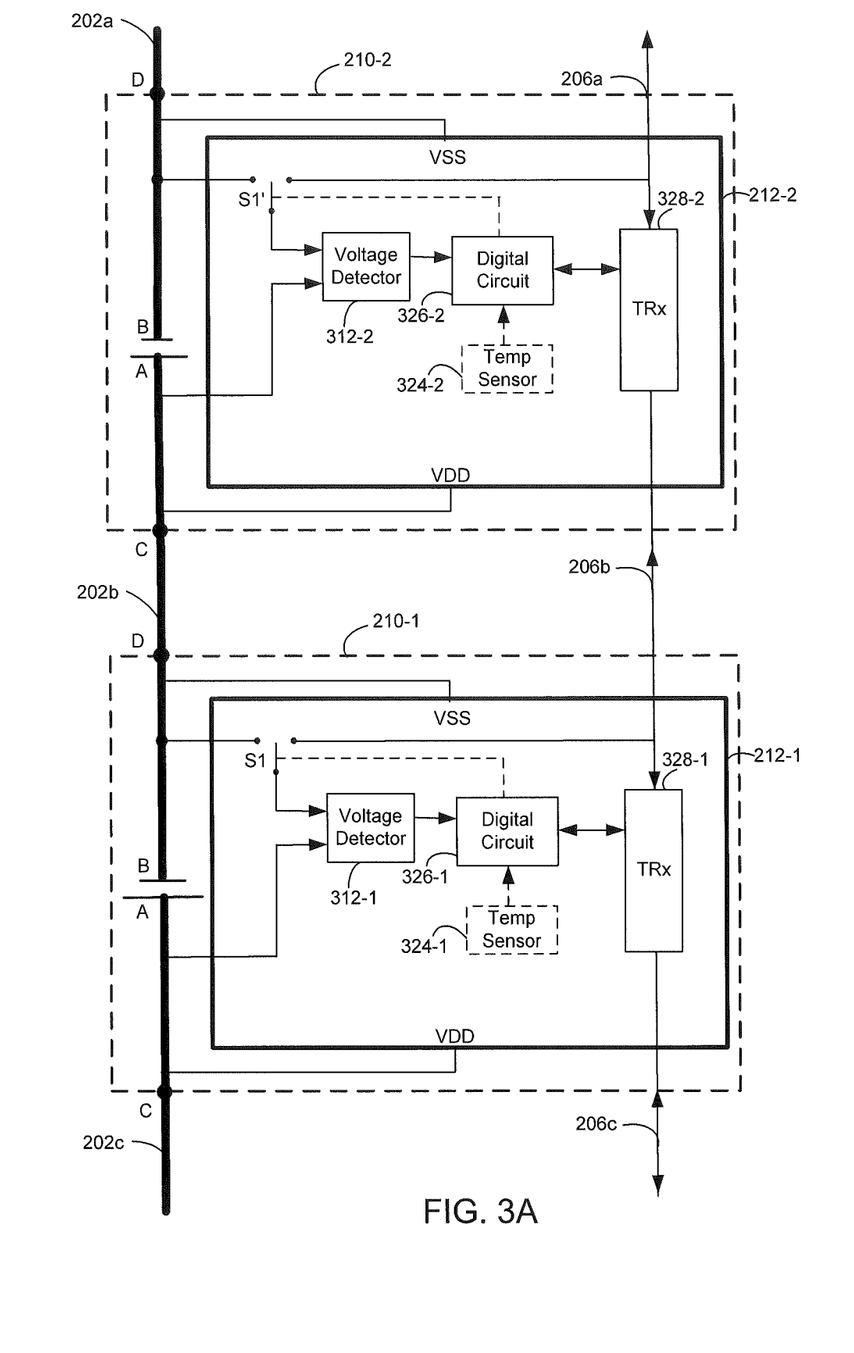
FIG. 3A is a block diagram of a battery pack with integrated supervisors, according to an embodiment of the invention.

FIG. 3A is a block diagram of a battery pack with integrated supervisors 212, according to an embodiment of this invention. By way of illustration, two battery cells 210-1 and 210-2 in the battery pack are shown, and they are connected to each other with a power bar 202b at nodes C and D. The battery cells 210-1 and 210-2 have supervisors 212-1 and 212-2 integrated therein, respectively. Note that the segment AC or BD represents the electrode of the respective battery cell 210. Other battery cells in the battery pack can be configured similarly.

The supervisor 212 each can include a digital circuit 326 for performing analysis on detected measurements or controlling operation of the battery cell 210 based on the measurements and/or commands from the pack controller 230 (see FIG. 2). A transmitter/receiver (TRx) 328 may also be provided for signal communication via the communication wires 206. For example, the TRx 328 may receive information from the digital circuit 326 and communicate it to other battery cells 210 and/or to the pack controller 230 via the communication wires 206. Also, the TRx 328 may receive a signal from other battery cells 210 and/or the pack controller 230 via the communication wires 206 and communicate it to the digital circuit 326.

Optionally, the supervisor 212 may further include a temperature sensor 324 for continuously monitoring the temperature within the battery cell 210, a pressure sensor (not shown), as well as other sensors for measuring other parameters of the battery cell 210. The digital circuit 326 may receive and analyze the various measurements to determine the state of health of the battery cell over time, and to control the operation of the battery cell 210 based on the measurements or commands from the pack controller 230.

According to an embodiment of this invention, each of the supervisors 212 may include a voltage detector 312, for measuring a voltage difference between two input terminals of the voltage detector 312. For better understanding, the following description may be directed to a certain battery cell (e.g., battery cell 210-1), but can be applied to other similarly configured battery cells. As shown in FIG. 3A, a first input terminal of the voltage detector 312-1 may be coupled to the electrode A of the battery cell 210-1, and a second input terminal of the voltage detector 312-1 may be coupled to a first switch S1. In a first state, the first switch S1 may couple the second input terminal of the voltage detector 312-1 to the electrode B of the battery cell 210-1, such that the voltage detector 312-1 measures a first voltage between the electrodes A and B of the battery cell 210-1. Typically, the first voltage represents a cell voltage of the battery cell 210-1.

In a second state, the first switch S1 may couple the second input terminal of the voltage detector 312-1 to the communication wire 206-b, such that the voltage detector 312-1 measures a second voltage between the electrode A of the battery cell 210-1 and the communication wire 206b. In an embodiment, the first switch S1 may be a single-pole double-throw (SPDT) switch, so as to selectively connect the second input terminal of the voltage detector 312 to the electrode B or the communication wire 206.

The communication on the communication wire 206b can take place in the current domain or voltage domain. If the communication is in the current domain (the transmitting potential, e.g., VDD, remains unchanged), the receiving side acts as virtual ground for the associated voltage detector 312-1, which is capable of performing a DC measurement between the electrode A of the battery cell 210-1 and the communication line 206b directly. On the other hand, if the communication is in the voltage domain, the voltage measurement may take place when the TRx 328-2 is transmitting on the communication line 206b at a potential of the electrode A of the battery cell 210-2. In particular, when the TRx 328-2 transmits at a voltage of the electrode A of the battery cell 210-2 (e.g., supply potential VDD), the potential on the communication wire 206b is the same as the electrode A of the battery cell 210-2. Consequently, the second voltage between the electrode A of the battery cell 210-1 and the communication wire 206b reflects a voltage between the electrode A of the battery cell 210-1 and the electrode A of the battery cell 210-2.

In addition, filtering or timing may be employed to separate a DC voltage from the communication signal on the communication line 206. Even no information needs to be communicated on the communication line 206b, the digital circuit 326-2 may instruct the Trx 328-2 to transmit dummy signal on the communication line 206b based on scheduled timing, for purpose of voltage measurement. As each supervisor 212 (in particular, the digital circuit 326) knows what communication is ongoing on the corresponding communication line 206, the digital circuit 326 can control the voltage detector 312 to perform voltage measurement at appropriate times.

The voltage detector 312 may pass the measured first and second voltages to the digital circuit 326, which may calculate a voltage difference between the first and second voltages. Alternatively, the digital circuit 326 may pass the measured first and second voltages to the pack controller 230 (e.g., via the TRx 328 and the communication wires 206), which may calculate a voltage difference between the first and second voltages. Such voltage difference between the first voltage and the second voltage represents a voltage drop on the power bar 202, and may reflect a contact condition between the power bar 202 and the cell electrodes. Consequently, the digital circuit 326 or the pack controller 230 may compare the computed voltage difference to a predetermined threshold (or threshold range), so as to ascertain whether a contact of an associated power bar is compromised (e.g., corroded, loose, or the like). The supervisor 210 or the pack controller 230 may indicate degraded contact of the power bar 202b if the voltage difference is out of the predetermined threshold range (e.g., the voltage difference is higher than a threshold).

Similarly, the voltage detector 312-2 in the battery cell 210-2 may monitor the contact condition of the power bar 202a by measuring a first voltage between the electrodes A and B of the battery cell 210-2, measuring a second voltage between the electrode A of the battery cell 210-2 and the communication wire 206a when the TRx 328-2 receives signal communication on the communication wire 206a from a next battery cell, and determining whether a voltage difference between the first and second voltages is out of the predetermined threshold range. In the same way, it is possible to monitor all the contacts between the power bars 202 and the associated cell electrodes in the battery pack.

As shown by dashed lines in FIG. 3A, the first switch S1 can be controlled by the digital circuit 326. Consequently, all the first switches S1 in the battery cells 210 can be controlled synchronously/individually, so that the voltage detector 312 in each battery cell 210 measures either a first voltage between the electrodes A and B of the battery cell 210, or a second voltage between the electrode A of the battery cell 210 and the corresponding communication wires 206 when the battery cell 210 receives signal communication on the communication wire 206. For example, in a first state, each first switch S1 may couple the second input terminal of the voltage detector 312 to the electrode B of the battery cell 210, such that the voltage detector 312 measures a cell voltage of the battery cell 210. In a second state, the first switch S1 may couple the second input terminal of the voltage detector 312 to the communication wire 206, such that the voltage detector 312 measures a second voltage between the electrode A of the battery cell 210 and the communication wire 206 when the battery cell 210 receives signal communication on the communication wire 206. Consequently, the pack controller 230 or the digital circuit 326 may control the first switch S1 to periodically, intermittently, or randomly measure the second voltage between the electrode A of the battery cell 210 and the communication wire 206.

Figure 3B:
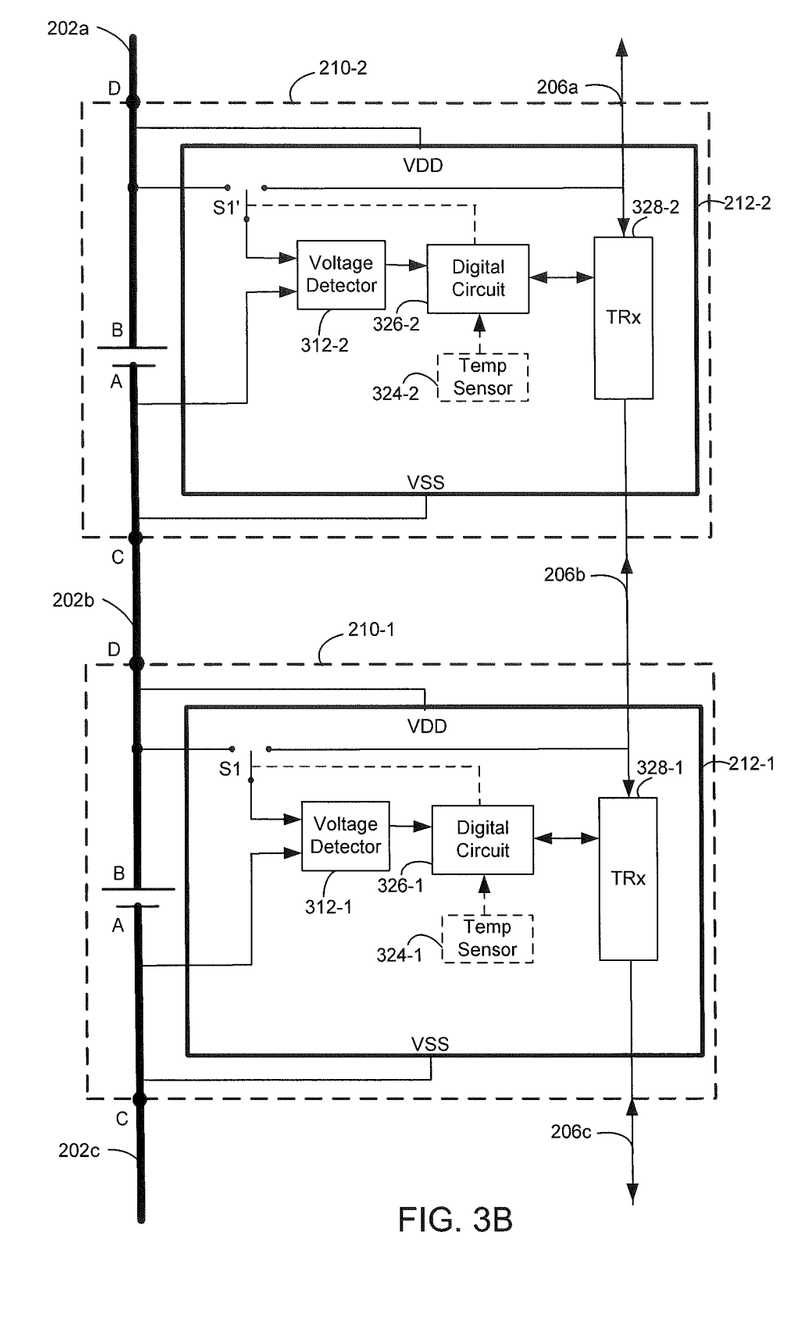
FIG. 3B is a block diagram of a battery pack with integrated supervisors, according to another embodiment of the invention.

Although FIG. 3A shows that the voltage detector 312 is always coupled to the positive electrode A of the battery cell 210, the polarity of each battery cell 210 may be reversed, as shown in FIG. 3B. In a first state, the first switch S1 may couple the second input terminal of the voltage detector 312-1 to the electrode B of the battery cell 210-1, such that the voltage detector 312-1 measures a first voltage between the electrodes A and B of the battery cell 210-1. In a second state, the first switch S1 may couple the second input terminal of the voltage detector 312-1 to the communication wire 206b, such that the voltage detector 312-1 measures a second voltage between the electrode A of the battery cell 210-1 and the communication wire 206b, when the TRx 328-2 transmits at a voltage of the electrode A of the battery cell 210-2 (e.g., ground potential VSS). In particular, when the TRx 328-2 transmits at a voltage of the electrode A of the battery cell 210-2 (e.g., ground potential VSS), the potential on the communication wire 206b is the same as the electrode A of the next battery cell 210-2. Accordingly, the supervisor 210 or the pack controller 230 may indicate degraded contact of the power bar 202b if the voltage difference between the first and second voltages is out of the predetermined threshold range (e.g., the voltage difference is higher than a threshold).

Figure 4:
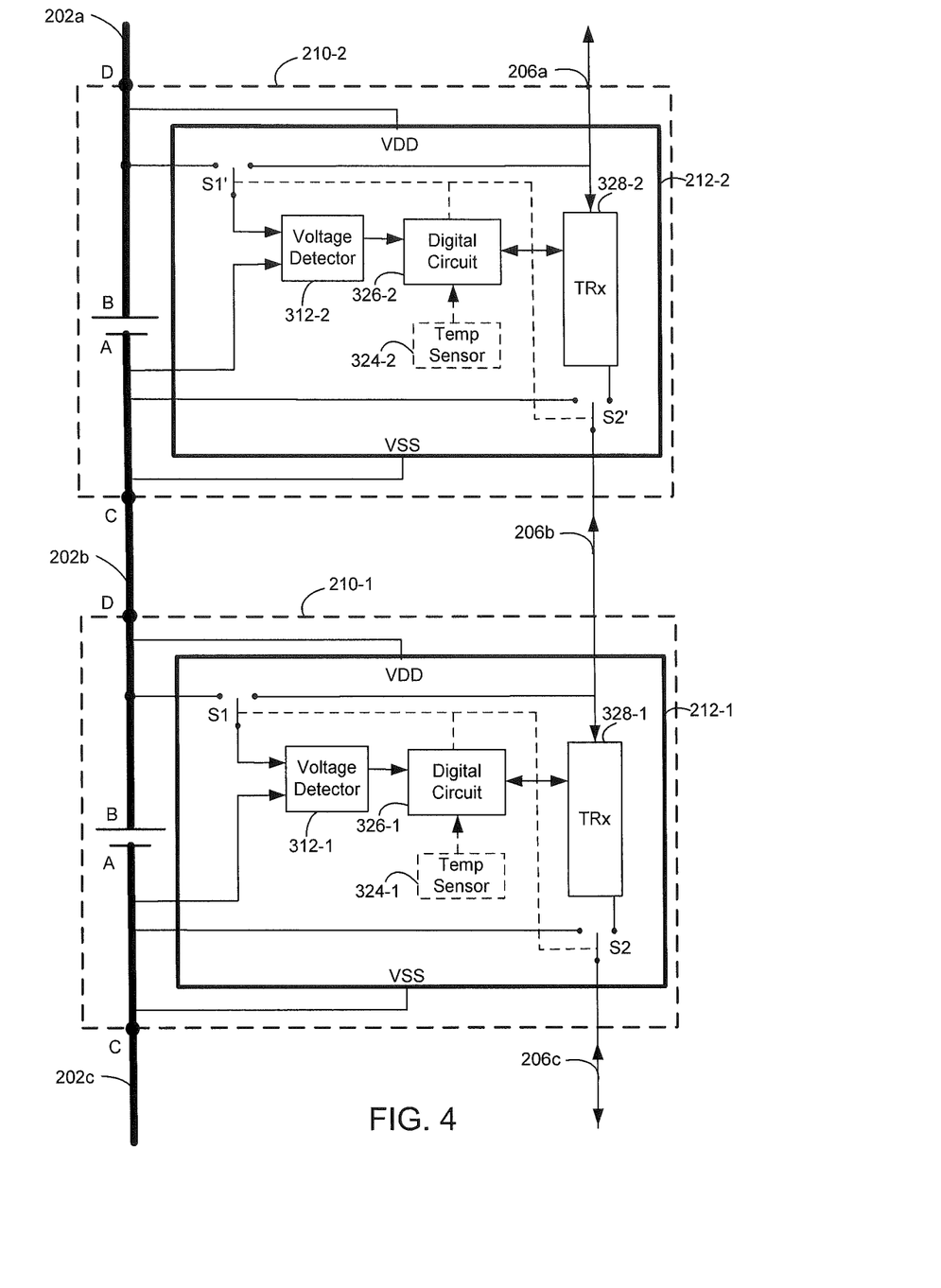
FIG. 4 is a block diagram of a battery pack with integrated supervisors, according to yet another embodiment of the invention.

FIG. 4 is a block diagram of a battery pack with integrated supervisors 212, according to yet another embodiment of this invention. FIG. 4 is similar to FIG. 3A, except that the supervisor 212 further includes a second switch S2 coupled to the communication wire 206. In a first state, the first switch S1 may couple the second input terminal of the voltage detector 312-1 to the electrode B of the battery cell 210-1, such that the voltage detector 312-1 measures a first voltage between the electrodes A and B of the battery cell 210-1. In the first state, the second switch S2 (and/or S2' in battery cell 210-2) may be open, or may couple the corresponding communication wire 206 to the TRx 328 for signal communication.

In a second state, the first switch S1 may couple the second input terminal of the voltage detector 312-1 to the communication wire 206b. Meanwhile, the second switch S2' couples the communication wire 206b to the electrode A of the battery cell 210-2, such that the voltage detector 312-1 measures a second voltage between the electrode A of the battery cell 210-1 and the electrode A of the next battery cell 210-2. In an embodiment, the second switch S2 may be a single-pole double-throw (SPDT) switch, so as to selectively connect the communication wire 206 to the electrode A or the TRx 328. As described above, the digital circuit 326 or the pack controller 230 may compute a voltage difference between the first and second measured voltages, and compare the computed voltage difference to a predetermined threshold (or threshold range), so as to ascertain whether a contact of an associated power bar 202b is compromised (e.g., corroded, loose, or the like). The supervisor 210 or the pack controller 230 may indicate degraded contact of the power bar 202 if the voltage difference is out of the predetermined threshold range (e.g., the voltage difference is higher than a threshold).

As shown by dashed lines in FIG. 4, the first switch S1 and second switch S2 can be controlled by the digital circuit 326. Consequently, the first switch S1 and second switch S2 in one battery cell 210 can be controlled synchronously, so that the voltage detector 312 measures either a first voltage between the electrodes A and B of the battery cell 210, or a second voltage between the electrode A of the battery cell 210 and the electrode A of the next battery cell 210. For example, in a first state, the first switch S1 may couple the second input terminal of the voltage detector 312 to the electrode B of the battery cell 210, and the voltage detector 312 measures a cell voltage of the battery cell 210. Also, each second switch S2 may couple the communication wire 206 to the TRx 328, which may communicate between the battery cells 210 via the communication wires 206. In a second state, the first switch S1 may couple the second input terminal of the voltage detector 312 to the communication wire 206, and a second switch S2 couples the communication wire 206 to the electrode A of the battery cell 210, such that the voltage detector 312 measures a second voltage between the electrode A of the battery cell 210 and the electrode A of the next battery cell 210. In this situation, the TRx 328 suspends the communication between the battery cells 210. Consequently, the pack controller 230 or the digital circuit 326 may control the first switch S1 and second switch S2 to periodically, intermittently, or randomly measure the second voltage between the electrode A of the battery cell 210 and the electrode A of the next battery cell 210.

With the supervisor 212 being located within the battery cell 210, the battery cell 210 supplies voltages VDD and VSS for the supervisor 212 from the respective electrodes A and B. In a normal condition, the digital circuit 326-1 will detect a zero (or small) voltage difference between the first and second voltages. Otherwise, if a contact C (or D) between the power bar 202b and the associated cell electrode is degraded and thus has an increased resistance, there will be an increased voltage drop on the degraded contact, causing the potential on the electrode A of the battery cell 210-2 to decrease. Consequently, the digital circuit 326-1 will detect a voltage difference change between the first and second voltages. If the detected voltage difference (e.g., the absolute value thereof) is out of a predetermined threshold range (e.g., exceeding a predetermined threshold), the digital circuit 326-1 may assert a signal to indicate degraded contact of the power bar 202b. For example, digital circuit 326-1 may send an alert signal to the TRx 328-1, which in turn transmits the alert signal to the pack controller 230.

Similarly, the voltage detector 312-2 in the battery cell 210-2 may monitor the contact condition of the power bar 202a. In the same way, it is possible to monitor all the contacts between the power bars 202 and the associated cell electrodes in the battery pack. Although FIG. 4 shows that the voltage detector 312 is always coupled to the negative electrode A of the battery cell 210, the polarity of each battery cell 210 may be reversed. The operations are similar to that as described above with respect to FIG. 4, and will not be repeated here.

Referring back to FIGS. 3A, 3B and 4, in an embodiment, the voltage detector 312 may be implemented with an Analog-to-Digital Converter (ADC) to sense the voltage (drop) between the two input terminals. The ADC may convert the measured voltage to a digital value and send it to the digital circuit 326 for processing. An advantage of digitizing is that the measured "contact" voltage can be divided by the pack current, so the contact resistance can be measured to a desired accuracy. In some applications, the ADC 312 may be time-multiplexed to alternately convert the first voltage or the second voltage. In a further embodiment, the digital circuit 326 may comprise an operational amplifier, an adder, a subtractor or a software routine to calculate a voltage difference between the first and second voltages. Moreover, the digital circuit 326 may comprise a comparator or a software routine to determine whether the voltage difference is within a predetermined threshold range (e.g., to compare the voltage difference with a predetermined threshold). In optional embodiments, the digital circuit 326 may be embodied in the supervisor of the battery cell 210, or may be embodied in the pack controller 230.

The threshold range (or threshold value) may be programmable or configurable, to optimize the system for different applications or usage scenarios. Such threshold range (or threshold value) may be determined based on the normal range (or normal value) and an appropriate margin. By example and without limitation, suppose a normal contact has a typical resistance of 0.1 mOhm and the pack current has a peak value of 200 A, resulting a peak contact voltage of 20 mV which is in the "normal" range. An appropriate threshold value for the comparator might be set as 40 mV, which would allow a contact resistance that has been doubled. The margins depend on the specific application and the overall constraints imposed on the battery pack.

The information detected by the voltage detector 312, among other measurements monitored by the supervisor 212, may be transmitted to the pack controller 230 through TRx 328 and the daisy chain of communication wires 206. As an option, either an OK/NOK signal indicating that the voltage across a power bar contact is below/above a threshold may be transmitted to the pack controller 230. Alternatively, the supervisor 212 may send the measured voltages to the pack controller 230, which then makes a determination as to whether the power bar contact is operating normally. In addition, the transmitted signal may include an identifier corresponding to the contact(s) being detected, such that the degraded contact(s) can be located accurately.

Any appropriate countermeasures may be taken if a degraded contact (e.g., due to corrosion, loose contact, etc.) is detected. For example, the pack controller 230 may warn the user (e.g., a car driver) that the battery pack should be checked or repaired. In addition or alternatively, the pack controller 230 may automatically cut off the battery pack upon detection of dramatic increase in the contact resistance either during charging or discharging, to protect the battery cells/pack from damage. Because the pack controller 230 can identify where the degraded contact is located, a user or technician can make correction very quickly and precisely.

For example, a loose bolt may be fastened or a corroded connector may be replaced, before the battery degrades catastrophically.

The embodiments described above provide a variety of advantages. The degradation (such as corrosion or loosening) of a contact can be detected by the cell supervisor. By measuring a first voltage between a first electrode and a second electrode of a battery cell in a first state, measuring a second voltage between the first electrode and a communication wire in a second state, and then monitoring the voltage difference between the first voltage and the second voltage, an increase of the contact resistance can be detected for each individual power bar in the battery pack. By reusing the communication wire to detect the second voltage, extra components or wires can be reduced. All required additional circuitry can be easily integrated into the cell supervisor. Such detection is beneficial to improve the performance of the battery pack, extend the battery lifetime between recharges, and avoid potential damage to the battery pack. In addition, the contact detection can be combined with other measurements, such as voltage, temperature, pressure, etc., without the need to add external components or wiring.

Aspects of the present invention are believed to be applicable to a variety of different types of devices, systems and arrangements involving batteries and/or battery control, including those involving automotive applications. While the present invention is not necessarily so limited, various aspects of the invention may be appreciated through a discussion of examples using this context.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A battery pack, comprising:
   at least a first battery cell and a second battery cell, the first battery cell having a first electrode and a second electrode, and the second battery cell having a third electrode and a fourth electrode;
   a power bar for connecting the second electrode of the first battery cell to the third electrode of the second battery cell;
   a communication wire coupled to a first transmitter/receiver in the first battery cell and a second transmitter/receiver in the second battery cell for signal communication between the first battery cell and the second battery cell, wherein the first battery cell comprises a supervisor, which comprises a voltage detector and a first switch, wherein the voltage detector has a first input terminal connected to the first electrode of the first battery cell and a second input terminal connected to the first switch, wherein the first switch connects the second input terminal of the voltage detector to the second electrode of the first battery cell in a first state to enable the voltage detector to measure a first voltage between the first electrode and the second electrode of the first battery cell, and wherein the first switch disconnects the second input terminal of the voltage detector from the second electrode of the first battery cell and connects the second input terminal of the voltage detector to the communication wire in a second state to enable the voltage detector to measure a second voltage between the first electrode of the first battery cell and the communication wire; and
   a digital circuit to compute a voltage difference between the first voltage and the second voltage, and to indicate degraded contact of the power bar if the voltage difference is out of a predetermined threshold range.

2. The battery pack of claim 1, wherein in the second state, the voltage detector measures the second voltage between the first electrode of the first battery cell and the communication wire when the second battery cell transmits on the communication wire at a voltage of the third electrode of the second battery cell.

3. The battery pack of claim 1, wherein the second battery cell further comprises a second switch, wherein in the second state, the second switch couples the communication wire to the third electrode of the second battery cell.

4. The battery pack of claim 3, wherein the first switch and the second switch are single-pole double-throw (SPDT) switches.

5. The battery pack of claim 1, wherein the degraded contact comprises at least one of contact corrosion or loose-contact.

6. The battery pack of claim 1, further comprising:
   a pack controller for controlling operation of the battery pack, wherein the at least the first battery cell and the second battery cell communicate with the pack controller through a daisy chain of communication wires,
   wherein the digital circuit is integrated in the supervisor of the first battery cell, or the digital circuit is integrated in the pack controller.

7. The battery pack of claim 1, wherein the digital circuit comprises:
   an operational amplifier, an adder, or a subtractor to calculate the voltage difference between the first and second voltages; and
   a comparator to determine whether the voltage difference is in the predetermined threshold range.

8. The battery pack of claim 1, wherein:
   the first electrode and the third electrode are positive electrodes, and the second electrode and the fourth electrode are negative electrodes; or
   the first electrode and the third electrode are negative electrodes, and the second electrode and the fourth electrode are positive electrodes.

9. The battery pack of claim 1, wherein the voltage detector comprises an Analog-to-Digital Converter (ADC).

10. A method for monitoring a battery pack that comprises at least a first battery cell and a second battery cell, the first battery cell having a first electrode and a second electrode, and the second battery cell having a third electrode and a fourth electrode, wherein the second electrode of the first battery cell is connected to the third electrode of the second battery cell by a power bar, wherein the first battery cell comprises a supervisor, which comprises a voltage detector and a first switch, wherein the voltage detector has a first input terminal coupled to the first electrode of the first battery cell and a second input terminal coupled to the first switch, the method comprising:
   connecting, by the first switch, the second input terminal of the voltage detector to the second electrode of the first battery cell in a first state;
   measuring, by the voltage detector, a first voltage between the first electrode and the second electrode of the first battery cell in the first state;

disconnecting the second input terminal of the voltage detector from the second electrode of the first battery cell;

connecting, by the first switch, the second input terminal of the voltage detector to a communication wire in a second state, wherein the communication wire is coupled to a first transmitter/receiver in the first battery cell and a second transmitter/receiver in the second battery cell for signal communication between the first battery cell and the second battery cell;

measuring, by the voltage detector, a second voltage between the first electrode of the first battery cell and the communication wire in the second state;

computing a voltage difference between the first voltage and the second voltage; and indicating degraded contact of the power bar if the voltage difference is out of a predetermined threshold range.

11. The method of claim 10, further comprising:

measuring the second voltage between the first electrode of the first battery cell and the communication wire in the second state when the second battery cell transmits on the communication wire at a voltage of the third electrode of the second battery cell.

12. The method of claim 10, further comprising:

coupling the communication wire to the third electrode of the second battery cell in the second state; and measuring the second voltage between the first electrode of the first battery cell and the communication wire.

13. The method of claim 10, wherein the degraded contact comprises at least one of contact corrosion or loose-contact.

14. The method of claim 10, wherein:

the first electrode and the third electrode are positive electrodes, and the second electrode and the fourth electrode are negative electrodes; or the first electrode and the third electrode are negative electrodes, and the second electrode and the fourth electrode are positive electrodes.

* * * * *